US009482719B2

(12) United States Patent
Syed

(10) Patent No.: US 9,482,719 B2
(45) Date of Patent: Nov. 1, 2016

(54) ON-THE-FLY TEST AND DEBUG LOGIC FOR ATPG FAILURES OF DESIGNS USING ON-CHIP CLOCKING

(71) Applicant: STMicroelectronics International N.V., Amsterdam (NL)

(72) Inventor: Danish Hasan Syed, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 254 days.

(21) Appl. No.: 14/152,130

(22) Filed: Jan. 10, 2014

(65) Prior Publication Data
US 2015/0198663 A1 Jul. 16, 2015

(51) Int. Cl.
*G06F 11/00* (2006.01)
*G01R 31/317* (2006.01)
*G01R 31/3181* (2006.01)

(52) U.S. Cl.
CPC ... *G01R 31/31724* (2013.01); *G01R 31/31705* (2013.01); *G01R 31/31813* (2013.01)

(58) Field of Classification Search
CPC ............. G01R 31/31813; G01R 31/31724; G01R 31/31705
See application file for complete search history.

(56) References Cited

U.S. PATENT DOCUMENTS

2011/0051497 A1* 3/2011 Kim .................. G11C 13/0004
365/148

OTHER PUBLICATIONS

Vorisek, Vlado et al.: "At-Speed ATPG for SoC-Designs," Motorola GmbH, Munich, SNUG Europe 2002 (19 pages).

* cited by examiner

*Primary Examiner* — Guy Lamarre
(74) *Attorney, Agent, or Firm* — Gardere Wynne Sewell LLP

(57) ABSTRACT

A semiconductor chip includes an OCC that receives an ATPG test pattern and generates clock pulses in response. An OCC test circuit detects clock pulses of the OCC circuit and provides debug data to test output configurable logic that also receives results from other circuits testing different DUT flip-flops. A clipping test circuit detects ATPG failures due to clipped clock pulses from the OCC by providing pulse-width sensitive flip-flop outputs to DUT I/Os. An IR drop test circuit detects if ATPG failures are due to IR-drop problems in certain flip-flops. A pulse bit manipulating circuit varies the test pattern provided to the OCC and OCC-generated clock pulses. A debug controller connected to test output configurable logic selects between results of the different tests for supply as an output test signal to be compared on-the-fly with expected pattern data on ATE and used to isolate errors on the chip.

18 Claims, 10 Drawing Sheets

ON-THE-FLY TEST AND DEBUG LOGIC FOR ATPG FAILURES OF DESIGNS USING ON-CHIP CLOCKING

BACKGROUND

Scan patterns are widely used to test the logic of a semiconductor chip. A well prepared scan test can detect a very high percentage of manufacturing failures, requiring a drastically smaller amount of test data and test time compared to functional tests. The basic concept of a scan test is to serially connect memory elements like flip-flops or latches into "scan chains" and shift test patterns through the scan chains into circuitry being tested (often called the "design under test" or "DUT"). The test pattern can be generated programmatically using standard automatic test pattern generation (ATPG) software. Once a test pattern is shifted to the DUT, outputs of the DUT logic are captured by additional memory elements and compared against expected values to determine whether the DUT is functioning properly.

A scan chain includes flip-flops connected in a sequential manner. These flip-flops are controlled by a "scan enable" signal to operate in two different modes: (1) a shift mode, and (2) a capture mode. While numerous configurations are used, the basic idea is to shift the test pattern into the flip-flops of the scan chain for supply to the DUT during shift mode and to capture the output of the DUT by the flip-flops (or other memory elements) during the capture mode. But measuring the output of the DUT is only useful for testing the DUT if all other components used to shift in and capture the test pattern are functioning properly. Unfortunately, this is not always the case.

On-chip clock controllers (referred to herein simply as "OCCs") are commonly used to control the flip-flops of a scan chain during the shift and capture modes. OCCs are clock-chopping circuits that ensure only a required number of clock pulses are provided to the DUT during capture mode. OCCs sometimes fail, experience glitches, or otherwise malfunction. Errors from the OCC, its clock-shaping circuitry, or the memory elements in a scan chain may affect the output of a DUT in response to a test pattern. The DUT itself may be functioning properly, but a faulty OCC may make the DUT appear to be malfunctioning.

Additionally, flip-flops and other memory elements may be affected by other types of errors. A chip may contain hundreds of OCCs to control circuitry, and each OCC generates different clock signals in different modes of operation. DUT may be sensitive to the pulse width of OCC clock pulses, OCC glitches, extra OCC clock pulses, or missing OCC clock pulses. Some flip-flops of the DUT that are present in IR drop hot spots are more prone to functional failures than other flip-flops of the DUT due to dynamic IR drop. Also, ATPG failures are sometimes not consistent in multiple runs of the same test pattern on the same sample of a device. Multiple runs of an ATPG pattern on automatic test equipment (ATE) may produce inconsistent failure logs. This inconsistency for the same testing sample can be present even though the same ATE voltage levels and timing are used when there is a change in any one of the testing conditions (e.g., voltage, current, power, etc.).

SUMMARY

This summary is provided to introduce a selection of concepts in a simplified form that are further described below in the Detailed Description. This summary is not intended to identify key features or essential features of the claimed subject matter.

One embodiment relates to detecting the number of clock pulses generated by an OCC. An OCC test circuit checks the number of clock pulses generated by the OCC and provides this information to test output configurable logic, which in turn maps the information to input/output (I/O) pins of an ATE. The test output configurable logic maps or otherwise routes OCC test signals to DUT I/Os during a capture mode of operation signaled by a scan enable signal. The data at the I/O pins can then be compared against expected data of an ATPG pattern by the ATE to determine whether the OCC generated the correct number of clock pulses in response to the ATPG pattern.

The test output configurable logic also receives outputs from additional test circuits for testing other problems that could cause APTG failures in a DUT. A clipping test circuit detects whether the failures in the ATPG pattern are due to clipped clock pulses from the OCC. An IR drop test circuit detects whether the failures in the ATPG pattern are due to the flip-flops that are placed under IR drop hotspots. To aid testing, a pulse bit manipulating circuit is used to manipulate when the OCC generates the clock pulses to either divide the frequency of the clock pulses by a particular factor or inject a specific delay.

A debug controller connected to the test output configurable logic selects which of the different test circuit results to map or route to the I/Os of the DUT. This enables different types of debug information from the different test circuits to be provided to the DUT I/Os. This information from the test circuits can be used to determine if the OCC has produced the wrong number of clock pulses, if ATPG failures are due to clock-clipping inside the OCC, if ATPG failures are due to delay defects in at-speed critical paths, or if ATPG failures are due to IR drops in IR drop hotspot critical DUT flip-flops.

Another embodiment is directed to testing the OCC and specific flip-flops on a semiconductor chip. The entire ATPG test pattern is repetitively provided to the DUT in a programmed sequential manner. A controller, called the ATPG-debug controller, takes the results from test debug circuits and provides them to I/Os of the DUT through the test output configurable logic circuit. In one embodiment, the test output configurable logic maps or routes this data to DUT I/O pins during a capture mode of operation to alleviate the need for additional I/Os for debugging purposes. This resultant data during capture phase can then be compared against expected data at I/Os by the ATE for each ATPG pattern.

In the case of ATPG pattern failures (i.e., the compared data does not match the expected data), one embodiment performs a first debug run of the ATPG pattern to check whether a phase-locked loop (PLL) correctly locks the phase of a reference clock signal. If so, the OCC is then checked to determine whether it is generating the quantity of clock pulses expected. If the OCC does provide the expected number of clock pulses, the pulse bit manipulating circuit manipulates at-speed testing by varying or delaying pulse bits provided to the OCC to instruct the generation of clock pulses, and the test pattern is run again. If the pattern fails again, then the ATPG-debug controller activates checking of the flip-flops for IR drops and clock pulse clipping at specific critical design areas during subsequent runs of the ATPG test pattern. All test outputs are provided to the test output configurable logic circuit, and the debug controller selects which of the test results to map or route to the DUT I/Os.

Another embodiment is directed to iteratively supplying different instances of the test pattern to an OCC and checking different aspects of the OCC itself and particular flip-flops in the DUT. This technique may be carried out by the ATPG-debug controller, using a loop counter and/or finite state machine (FSM). An initial pass of the test pattern is supplied, and the output of the OCC is mapped or routed to the DUT I/Os. The test pattern can then be manipulated by relaxing the frequency of OCC's clock output, corresponding debug data can be mapped to the DUT I/Os and checked for errors. The debug data includes the number of clock pulses generated by the OCC 106. Additional instances of the test pattern data, manipulated in other ways (e.g., different frequencies or with a delay), and responsive outputs of the OCC test circuit, or debug data from DUT, can be mapped to the I/Os and checked for errors. Subsequent instances of the test pattern data can then be supplied to the OCC, and the IR drop test circuit and clipping test circuit can be mapped to the DUT I/Os for monitoring.

The foregoing and other features and advantages of the present disclosure will become more apparent from the following detailed description of the embodiments read in conjunction with the accompanying drawings. The detailed description and drawings are merely illustrative of some different embodiments, rather than limiting the scope of the invention as defined by the appended claims and equivalents thereof.

DETAILED DESCRIPTION OF THE DRAWINGS

Figure 1:
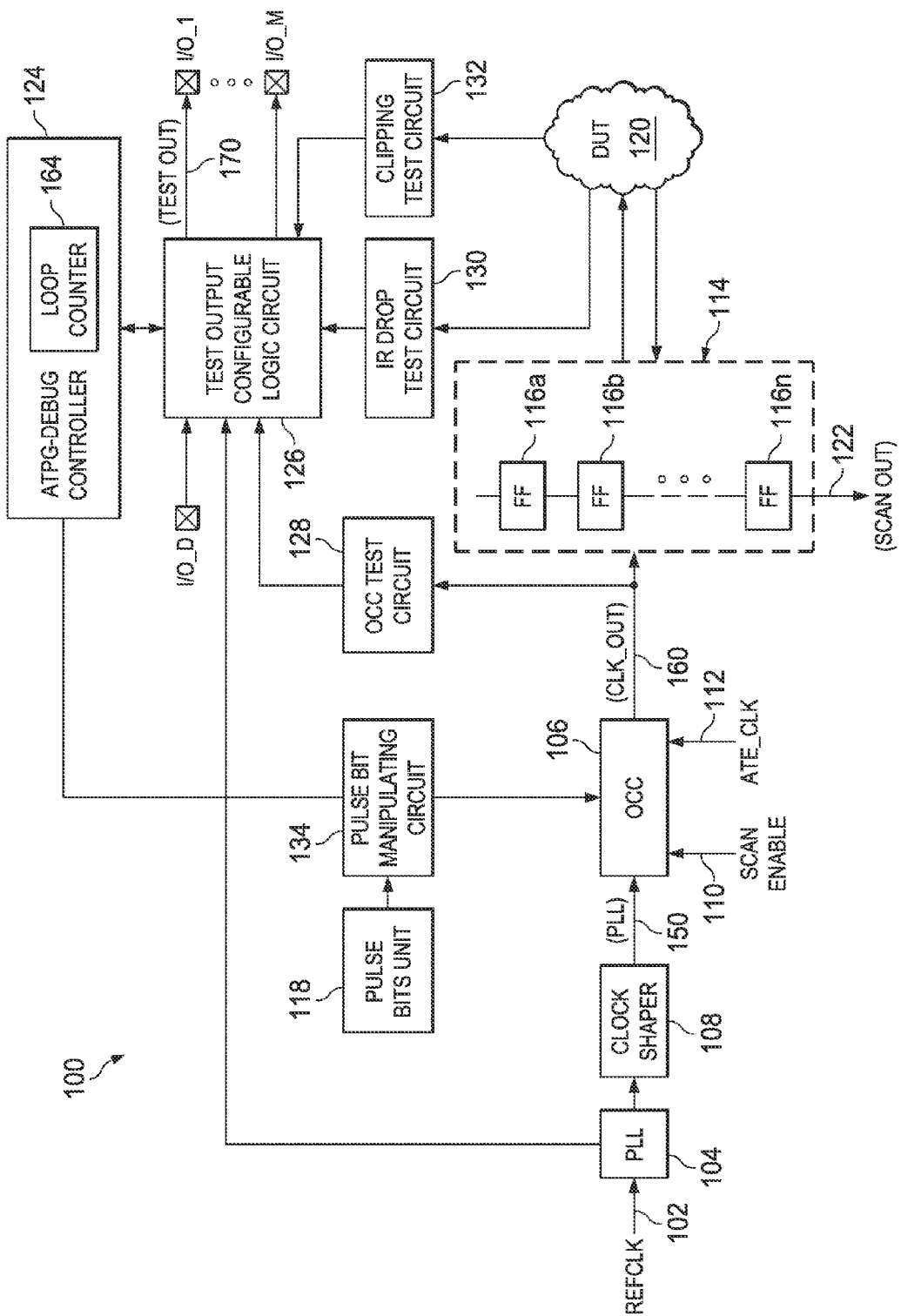
FIG. 1 illustrates a semiconductor chip with a DUT and having various test circuits.

FIG. 1 illustrates a portion of a semiconductor chip 100 with particular logic to be tested and various testing circuits. A reference clock 102 is received from on or off the chip, such as from a master clock, and is provided to a PLL 104 generating a PLL clock signal to be provided to a clock shaper 108 for manipulation and to a test output configurable logic 126 for testing of whether the PLL 104 properly locked the phase or frequency of REFCLK 102. A clock shaper 108 takes the PLL clock signal from PLL 104 and manipulates it in one manner or another using a multiplier, divider, delay, or other logic device capable of manipulating a clock frequency; although, not all embodiments will use a clock shaper 108 and will instead directly provide the clock signal from PLL 104 to OCC 106. For purposes of the discussion herein, and for the sake of clarity, the clock signal produced by the PLL 104 and the clock shaper 108 is referred to as the "PLL clock signal 150." The OCC 106 receives the PLL clock signal 150 from clock shaper 108, outputs from pulse bits unit 118 along with a scan enable signal 110 and an automated testing equipment (ATE) clock signal (ATE_CLK) 112, and uses all four to generate its own OCC clock signal, shown a CLK_OUT 160, to supply to a scan chain 114 of sequentially connected flip-flops 116a-n.

As previously stated, ATPG scan methods generally operate in two different modes: shift mode and capture mode. In shift mode, indicated in some embodiments by the scan enable signal 110 being asserted high, the OCC 106 provides CLK-OUT 160 same as ATE_CLK 112 to scan chain 114, which in turn shifts the test pattern in one flip-flop 116 at a time. In capture mode, the test pattern data is provided to the OCC 106 by a pulse bits unit 118 that instructs the OCC 106 to select or generate specific clock pulses of the PLL clock signal 150. For each bit of a clock chain, a value of "1" indicates that OCC 106 allows one pulse of PLL clock signal 150 and a value of "0" indicates that OCC 106 does not allow a pulse of the PLL clock signal 150. For example, the pulse bits unit 118 may be set to the eight-bit value of 00100110 to instruct OCC 106 to allow clock pulses on the third, sixth, and seventh clock cycles of the PLL clock signal 150 while keeping the other clock cycles (first, second, fourth, fifth, and eighth) asserted low. As a result, the OCC 106 creates an output clock signal CLK_OUT 160 that comprises three clock pulses of the PLL clock signal 150. In one embodiment, this only occurs during the capture mode.

During the shift mode, OCC 106 ensures that CLK_OUT 160 is the same as ATE clock 112. In shift mode (i.e., scan enable 110 is high), scan chains 114 are filled with ATPG data bit-by-bit in flip-flops 116a-n through test input (TI) pins of flip-flops 116a-n. When the scan enable signal 110 switches from shift to capture mode, the flip-flops 116a-n supply the shifted-in test pattern to connected functional logic or flip-flops of the DUT 120. Either the same or additional scan chain flip-flops 116a-n capture—on data pins of flip-flops 116a-n—the returned values from the DUT 120 being tested and provide the results as SCAN OUT 122, which can be compared against an expected scan chain value at an ATE. If SCAN OUT 122 matches the expected value, the DUT 120 is functioning properly. If SCAN OUT 122 does not match the expected value, an error may be inferred in either the DUT 120 or the testing circuitry made up of the PLL 104, the clock shaper 108, the OCC 106, or the scan chain 114.

Multiple test circuits are used to identify specific problems causing ATPG test pattern errors. These circuits include an OCC test circuit 128, an IR drop test circuit 130, and a clipping test circuit 132. The OCC test circuit 128 is designed to indicate whether the OCC 106 is providing an OCC output (CLK_OUT 160), corresponding to the test pattern data of the pulse bits unit 118. The IR drop test circuit detects whether ATPG failures are due to specific IR-drop-sensitive flip-flops in the DUT 120 due to large or problematic IR drops. The clipping test circuit 132 detects whether ATPG failures are due to pulse-width sensitive flip-flops in the DUT 120 are receiving clipped clock pulses of CLOCK_OUT 160.

In one embodiment, outputs from these three test circuits and the signal from PLL 104 are provided as inputs to a test output configurable logic circuit 126. An ATPG-debug controller 124 selectively configures the test output configurable logic circuit 126 to map or route either one of the received test circuit outputs or the status signal from the PLL 104 to physical input/output pins I/O_1-M of the DUT 120 to be checked by ATE. Thus, test output configurable logic circuit 126 receives the PLL 104 status signal and test outputs from the OCC test circuit 128, the IR drop test circuit 130, and the clipping test circuit 132, and ATPG-debug controller 124 selects one of those four to provide as output TEST OUT 170 for mapping or routing to I/O_1-M of the DUT for checking at ATE. For example, the ATPG-debug controller 124 can configure the test output configurable logic circuit 126 to pass the received values from the OCC test circuit 128 as TEST OUT 170. In some embodiments, outputs of the testing circuits or PLL 104 are mapped or routed to I/O_1-M during the capture mode, specifically 1-10 clock cycles before switching to shift mode.

Test output configurable logic circuit 126 can be configured to function in different manners. First, it can be configured as a multiplexer, switching between the input values from the PLL 104 signal, the OCC test circuit 128, the IR drop test circuit 130, and the clipping test circuit 132. Second, it can be configured as a mapper that maps, in a one-to-one manner, the inputs of the test output configurable logic circuit 126 to I/O_1-M. Third, it can be configured as a router that maps, in a many-to-one or one-to-many manner, the inputs of the test output configurable logic circuit 126 to I/O_1-M. Fourth, it can include logic between its inputs and outputs for performing different Boolean operations (e.g., invert, AND, OR, etc.).

In one embodiment, a test pattern (not shown) is repeatedly provided to the OCC 106, through pulse bits unit 118, so that the OCC 106 can, in response, output clock pulses as CLK_OUT 160 that correspond to the test pattern. CLK OUT 160 is provided directly to the OCC test circuit 128 and indirectly, though specific flip-flops in the DUT 120, to the IR drop test circuit 130 and the clipping test circuit 132.

In one embodiment, a test pattern of data is repeatedly provided to the OCC 160 through pulse bits unit 118 so that results from all or some of the three test circuits (OCC test circuit 128, IR drop test circuit 130, and clipping test circuit 132) can be analyzed. On-the-fly ATPG pattern debugging is performed by selectively mapping or routing the outputs of the various test circuits to I/O_1-M of the DUT 120 to be check on ATE with expected data. The test pattern can be fed to OCC 106 on a set loop controlled by a loop counter 164 in the ATPG-debug controller 124. For example, in a first instance of the test pattern, the ATPG-debug controller 124 may configure the test output configurable logic circuit 126 to pass the results of the OCC test circuit 128 to I/O_1-M. In a second instance of the test pattern data, the ATPG-debug controller 124 may configure the test output configurable logic circuit 126 to pass the results of the OCC test circuit 128 to I/O_1-M after a pulse bit manipulating circuit 134 manipulates the test pattern. Such test pattern manipulation is shown and discussed in reference to FIGS. 4-7. In a third instance of the test pattern, the ATPG-debug controller 124 may configure the test output configurable logic circuit 126 to pass the results of the IR drop test circuit 130 to I/O_1-M. In a fourth instance of the test pattern, the ATPG-debug controller 124 may configure the test output configurable logic circuit 126 to pass the results of the clipping test circuit 132 to I/O_1-M. In a fifth instance of the test pattern, the ATPG-debug controller 124 may configure the test output configurable logic circuit 126 to pass the signal from the PLL 104. So the test pattern data may be repeatedly supplied and manipulated so that the outputs of different test circuitry can sequentially be tied to I/O_1-M, giving a tester or testing program the ability to read the I/O_1-M and make various debugging determinations. This type of sequential testing allows the I/O_1-M to change on-the-fly to reveal various aspects of DUT 120 testing circuitry as well as the operation of specific flip-flops in the DUT 120—i.e., IR drop hotspot flip-flops and pulse-width-critical flip-flops, which are discussed in more detail below.

In one embodiment, mapping or routing of the test circuit outputs to I/O_1-M is done when the scan enable signals the capture mode, which is different than conventional techniques for DUT testing. In one embodiment, test output configurable logic 126 switches I/O_1-M to outputs of the test circuitry one to five clock cycles before the start of the shift mode, and scan enable 110 is held in capture mode for an additional number of clock cycles (e.g., 1-5).

Some errors may be caused by the inability of OCC 106 to precisely generate clock pulses at the speed of PLL clock signal 150. This may be a problem in some instances, but in others the OCC 106 may still be functional for its purpose at slower clock speeds. To figure out whether the speed of the PLL clock signal 150, or some defect in the critical path being tested is delaying the data arrival at capture flip-flops 116 of the scan chain 114, the ATPG-debug controller 124 uses the pulse chain bit manipulating circuit 134 to slow the at-speed frequency by manipulating the pulse bits 228 being provided to the OCC 106 to achieve a particular division factor (e.g., divided by two, three, etc.). If the correct number of OCC 106 test pulses are generated but an ATPG pattern still results in failures, a second run of ATPG pattern is run at a slower frequency by manipulating pulse bits 228 (e.g., pulse bits 228 divided by two or three). For example, if the OCC 106 generates the wrong number of clock pulses for regular pulse bits 228, there is no need to debug further, but if OCC is generating the correct number of pulses then there is a need to debug further to understand reason of ATPG failures. The test pattern will be resupplied to the OCC 106, and the pulse bit manipulating circuit 134 will change the pulse bits 228 to reflect the originals at half the frequency. The OCC test circuit 128 can then capture the debug data comprising the number of clock pulses responsively generated by the OCC 106. The same process can occur by manipulating the pulse bits 228 again to divide their frequency by three and rechecking the output of OCC test circuit 128 to see whether there are failures when the ATPG test pattern is run. This process may occur iteratively through different runs of the test pattern controlled by the ATPU-debug controller 124 and its loop counter or spontaneously.

The illustrated embodiment shows pulse bits unit 118 providing the input to pulse bit manipulating circuit 134, which in turn provides the pulse bits to OCC 106. In one embodiment, the pulse bit manipulating circuit 134 provides unaltered pulse bits to OCC 106 in one pass of the ATPG test pattern data and manipulated pulse bits, when instructed by ATPG-debug controller 124, during other passes of the ATPG test pattern data. For example, pulse bit manipulating circuit 134 may provide the pulse bits from pulse bits unit 118 directly to OCC 106 in a first pass of ATPG test pattern data, and thereafter in a second instance of ATPG test pattern data, upon instruction from ATPG-debug controller 124, manipulate pulse bits for a second pass. In this vein, the pulse bit manipulating circuit 134 operates in transparent mode and manipulated mode. In transparent mode, no manipulation of pulse bits from pulse bits unit 118 is performed. In manipulated mode, the pulse bits are manipulated, e.g., by dividing their frequency by a particular factor or by injecting a delay of K clock periods.

Figure 2:
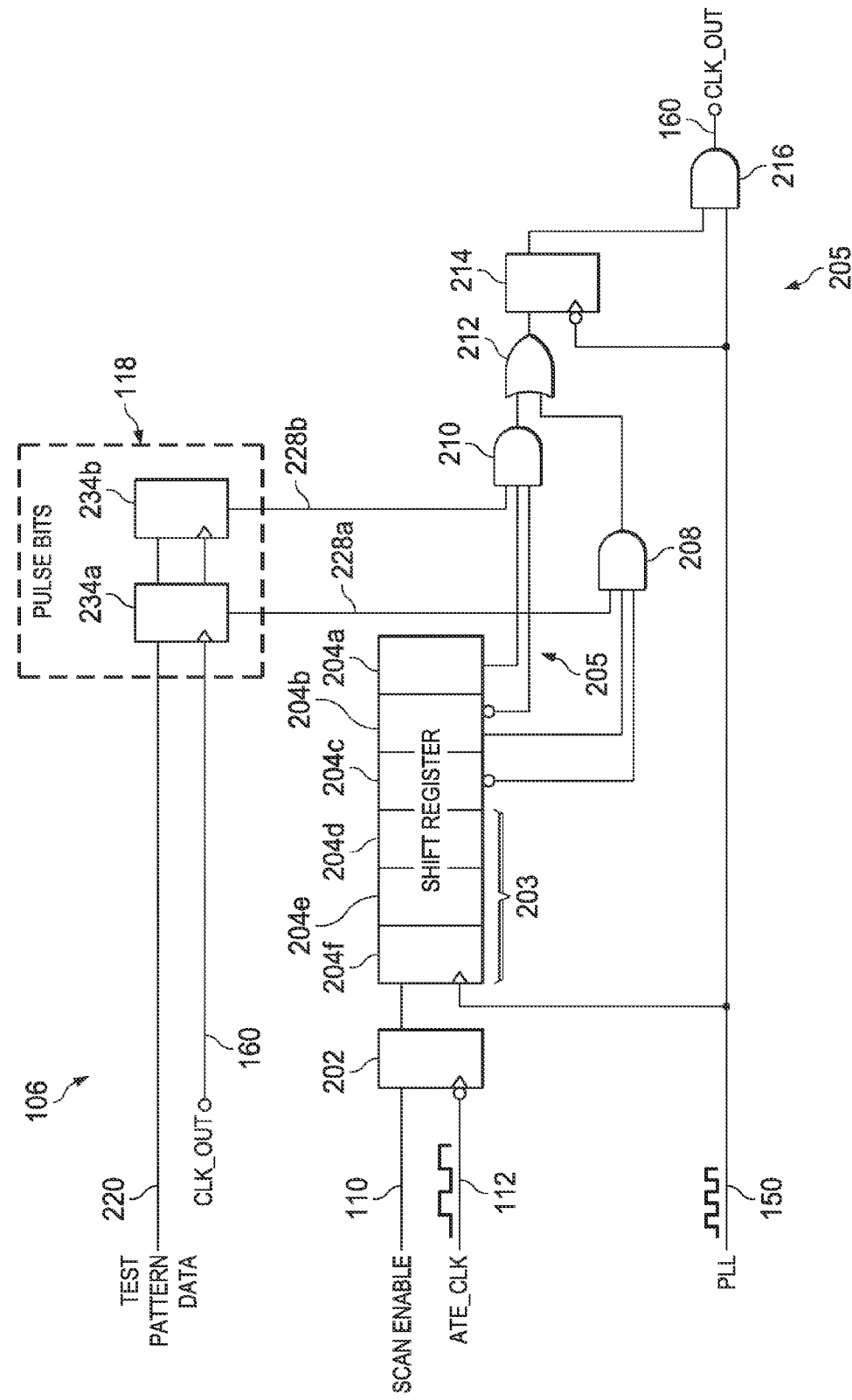
FIG. 2 illustrates an example of an OCC.

An example of the OCC 106 is shown in more detail in FIG. 2. The OCC 106 receives the scan enable signal 110, the ATE clock signal 112, the PLL clock signal 150, and test pattern data 220. An input flip-flop 202 receives the scan enable signal 110 and clocks it according to ATE_CLK 112, which in one embodiment is slower than PLL clock signal 150. The output of flip-flop 202 is received as an input by a block of shift registers 204f, 204e, 204d, 204c, 204b, 204a, where register 204f is the first register, located closest to the flip-flop 202, and register 204a is the last register, located furthest from the flip-flop 202. The first three registers 204f, 204e, 204d form a "metastability" unit 203 for synchronizing the output of flip-flop 202 with the PLL clock signal 150, and the last three registers 204c, 204b, 204a are used to generate clock pulses of PLL clock signal 150. The number of flip-flops 204 of the shift registers may vary depending on the design implementation.

Pulse bits 228a,b receive the test pattern data 220 and the OCC 106 output signal CLK_OUT 160 and signal when to generate clock pulses of PLL clock signal 150. Put another way, pulse bits 228a,b define the PLL clock pulses for the OCC 106 to generate. Only two flip-flops 234a,b and two pulse bits 228a,b are shown for the sake of clarity, but embodiments may include any number of flip-flops 234 and pulse bits 238. In operation, the test pattern data 220, which may be generated programmatically by an ATPG procedure or provided manually by a tester, is clocked into flip-flops 234a,b at the PLL clock signal 150 rate. The inverted output of register 204c, the non-inverted output of register 204b, and the pulse bit signal 228a are provided as inputs to a first AND gate 208. The non-inverted output of the register 204a, the inverted output of the register 204b, and the pulse bit signal 228b are provided as inputs to a second AND gate 210. Outputs of AND gates 208 and 210 are received as inputs to an OR gate 212. The output of OR gate 212 is received as an input to flip-flop 214 that clocks the output of OR gate 212 according to the PLL clock signal 150. AND gate 216 generates the requested number of clock pulses of CLK_OUT 160—an output of OCC 106—according to pulse bits 228a,b. CLK_OUT 160 is provided out of OCC 106 and is also fed back to the pulse bits unit 118 to supply the clock input of the flip-flops 234a,b.

It should be noted that the illustrated example of OCC 106 in FIG. 2 is but merely one embodiment of OCC 106. One skilled in the art will understand and appreciate that numerous other OCC designs may be used to generate clock pulses of PLL clock signal 150. Thus, embodiments are not limited to any particular OCC design or implementation.

Figure 3:
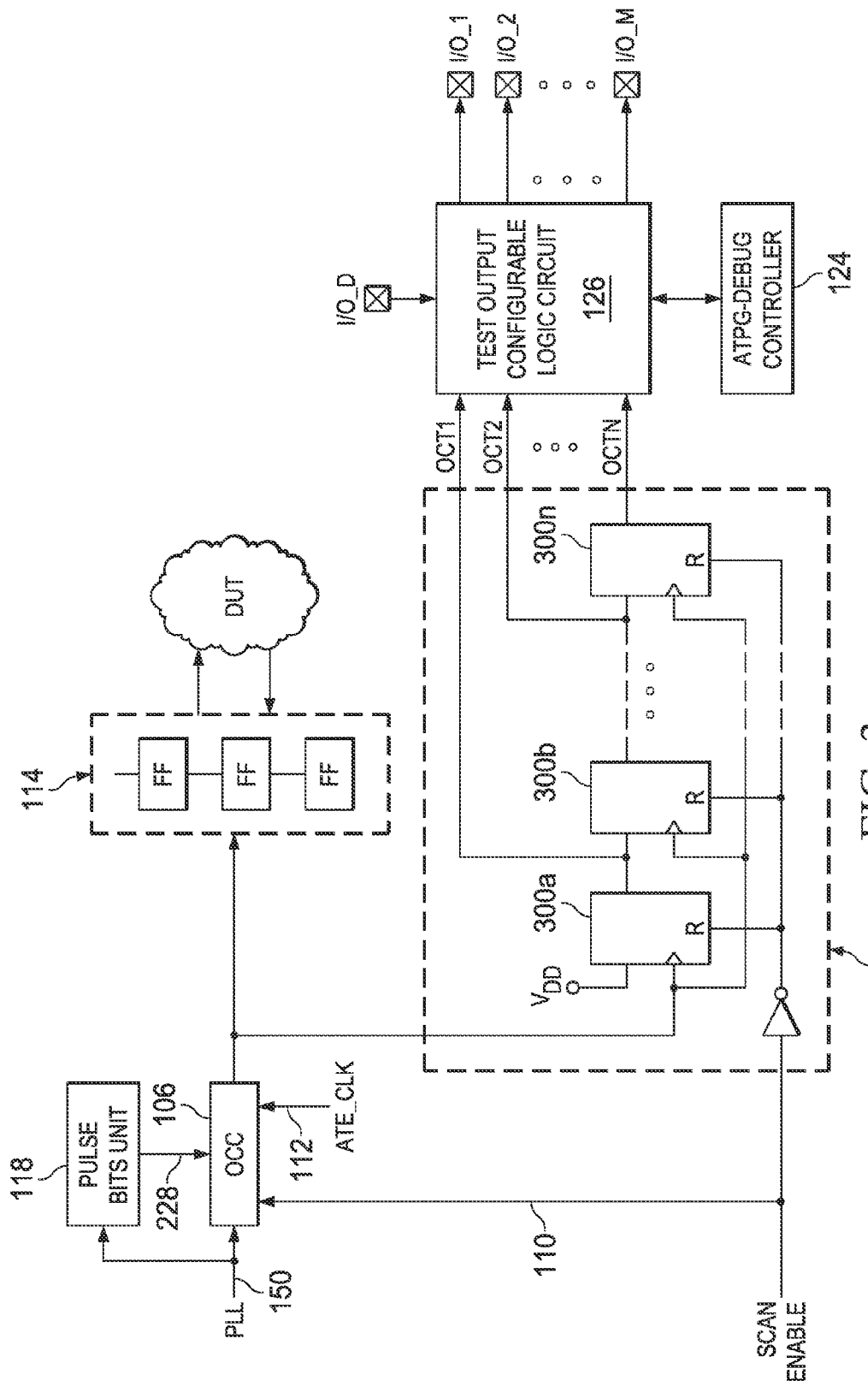
FIG. 3 illustrates a diagram of an OCC test circuit testing circuit.

FIG. 3 illustrates a diagram of OCC test circuit 128 for checking whether the OCC 106 is generating the correct number of clock pulses of PLL clock signal 150. It is critical that OCC 106 generates the correct number of clock pulses on the correct clock cycles of PLL clock signal 150; otherwise, circuitry being tested may appear faulty when in fact the OCC 106 is not functioning properly. In one embodiment, during the capture mode, the OCC test circuit 128 checks if OCC 106 is producing the correct number of clock pulses as programmed in pulse bits unit 118. For example, if pulse bits unit 118 signals clock pulses on the first, fourth, and sixth clock cycles, the OCC test circuit 106 will check to see that three clock pulses were generated. Some embodiments may carry such a determination a step further and make sure that the three clock pulses were generated on the correct clock cycles; while other embodiments just check the number of pulses generated.

To determine the number of clock pulses generated by OCC 106, the OCC test circuit 128, in one embodiment, includes sequentially connected flip-flops 300a-n that receive the clock pulses from OCC 106 as their clock inputs. The data input line of the first flip-flop 300a is asserted high, shown as being tied to $V_{DD}$, making the data output of all flip-flops present in the OCC test circuit 128 change according to the clock pulses generated by the OCC 106 during capture phase. The output of flip-flop 300a is connected to the input of 300b, and the rest of flip-flops 300b-n are connected in the same manner to enable the $V_{DD}$ input connected to 300a to shift forward as per the clock pulses received from OCC. The flip-flops 300a-n also receive an inverted version of the scan enable signal 110 at their reset inputs. In operation, all the flip-flops 300a-n are reset when the scan enable signal 100 signals the shift mode and are operative during the capture mode.

In one embodiment, outputs OCT1-N of flip-flops 300a-n are provided during capture mode—for 1-5 clock cycles before shift mode starts but after the clock pulses are generated by OCC 106 on CLK_OUT 160—to the test output configurable logic circuit 126 for mapping or routing to I/O_1-M of DUT 120 for checking on ATE. The ATPG-debug controller 124 communicates with the test output configurable logic circuit 126 to map or route OCT1-N of OCC test circuit 128 to I/O_1-M upon instruction by the ATPG-debug controller 124, such as during a specific counter value of loop counter 164, when outputs from the IR drop test circuit 130 and clipping test circuit 132 are not being mapped/routed, or during another event. Outputs OCT1-N may be mapped directly to I/O_1-M in a one-to-one mapping or routed through logic of the test output configurable logic circuit 126 in a many-to-one fashion. Other embodiments may perform different Boolean operations on OCT1-N before being routed to I/O_1-M, such as inverting one or more of the signals or passing them through combinational logic (e.g., AND, OR, XOR, etc.). Thus, the outputs OCT1-N of flip-flops 300a-n are captured by test output configurable logic circuit 126 and, upon request of the ATPG-debug controller 124, mapped or routed to I/O_1-M, which a tester (e.g., ATE) or device can read and understand how many clock pulses are being generated by OCC 106. I/O_1-M can then be analyzed to pinpoint test pattern failures due to erroneous OCC 106 clock pulses that suggest the OCC 106 is malfunctioning.

Figure 4:
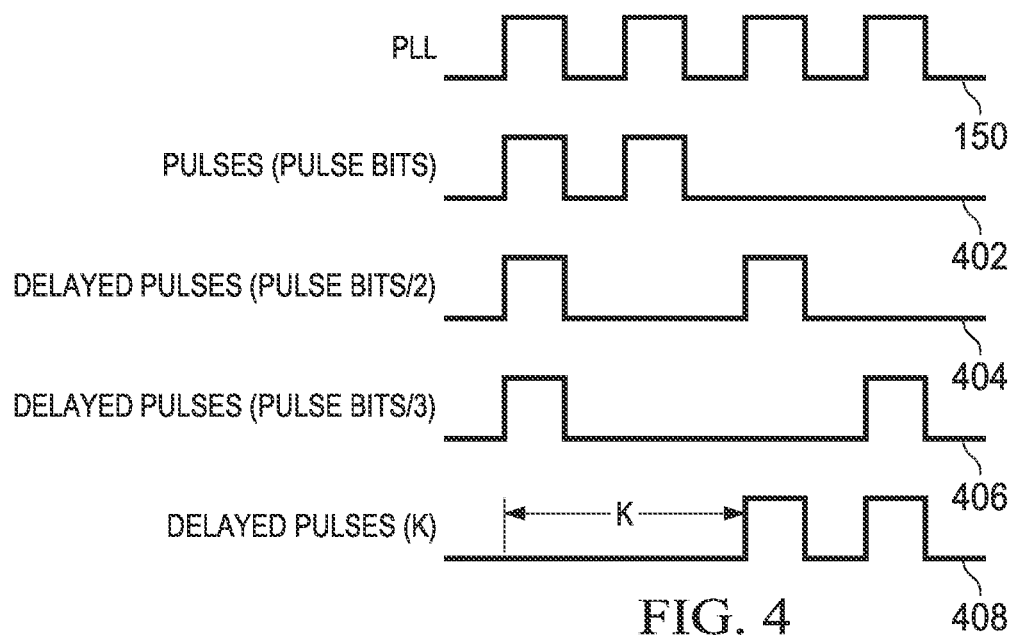
FIG. 4 illustrates a waveform diagram depicting instructive pulse bits, and manipulated pulse bits.

FIG. 4 illustrates a waveform diagram depicting normal clock pulses and delayed clock pulses when the frequency of the pulse bits 228 are divided or a delay (K cycles or periods) is introduced. The pulse bit manipulating circuit 134 includes circuitry described below that, in effect, relaxes the frequency of the pulse bits 228 so that the OCC 106, when functioning properly, generates the delayed waveforms 404 and 406 and generates waveform 408 when delay K is introduced. A first waveform 400 shows the PLL clock signal 150 received by the OCC 106. A second waveform 402 shows two clock pulses of the PLL clock signal 150 generated according to pulse bits 228 on specific clock cycles of the PLL clock signal. A third waveform 404 shows clock pulses being generated according to manipulated pulse bits 228 having a frequency that has been divided by two. A fourth waveform 406 shows clock pulses being generated according to manipulated pulse bits 228 having a frequency that has been divided by three. Other embodiments may divide the frequency of the pulse bits 228 by other factors (e.g., 1.5, 4, 5, etc.). Finally, a fifth waveform 408 shows clock pulses being generated after a delay (K cycles or periods) is introduced.

Figure 5:
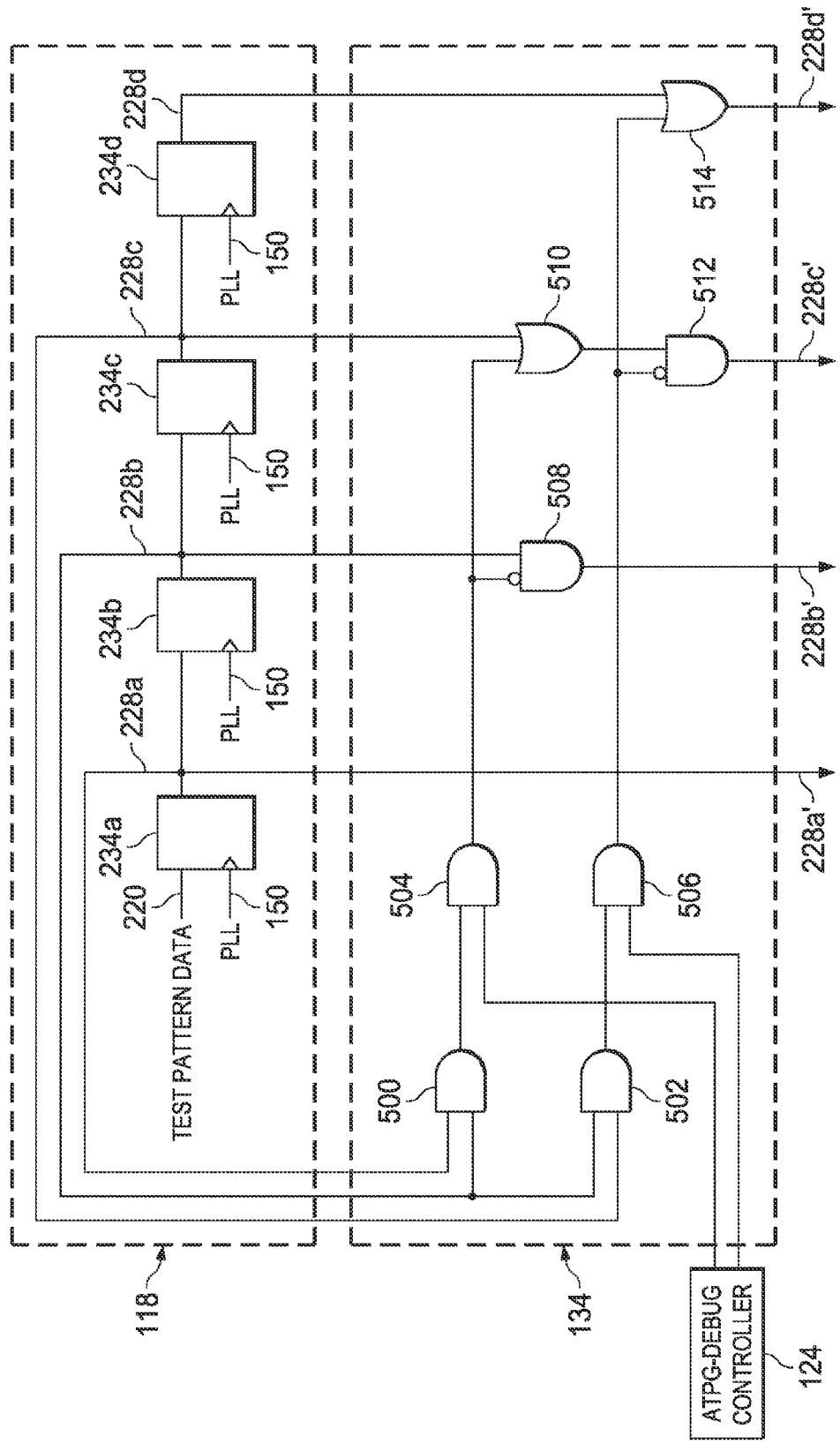
FIG. 5 illustrates a pulse bit manipulating circuit generating pulse bits to help generate half the frequency of a PLL clock signal.

FIG. 5 illustrates an example of the pulse bit manipulating circuit 134 receiving manipulating the pulse bits 228a-d from the pulse bits unit 118. The pulse bits unit 118 comprises of four flip-flops 234a-d connected in series, with each receiving the PLL clock signal 150 as a clock input. In operation, the ATPG-debug controller 124 configures pulse bit manipulating circuit 134 to route pulse bits 228a-d from flip-flops 234a-d through the shown combinational logic to produce delayed bits 228a'-d', effectively dividing the frequency determined by pulse bits 228a-d by a factor of two. For example, pulse bits 228a-d having values set to "1100" may be translated to "1010," or "0110" may be translated to "0101." While only four flip-flops 234a-d and delayed bits 228a'-d' are shown for the sake of clarity, embodiments may include N number of flip-flops 234 producing N number of delayed bits. Moreover, the illustrated combinational logic can be replicated to scale the pulse bit manipulating circuit 134 to handle more than four pulse bits 228.

One embodiment of the combinational logic in the pulse bit manipulating circuit 134 includes the illustrated collection of AND and OR gates. AND gate 500 receives as inputs pulse bits 228a and 228b, and AND gate 502 receives pulse bits 228b and 228c. AND gates 504 and 506 each receive the outputs of AND gates 500 and 502, respectively, as one input and are connected to the ATPG-debug controller 124 for the other input. The ATPG-debug controller 124 can selectively access—i.e., turn on—the pulse chain bit mapping circuit 134 by passing a high assertion signal to AND gates 504 and 506. Pulse bit 228a is directly mapped out as delayed bit 228a' because, in one embodiment, it represents the first clock pulse signal and therefore does not need to be manipulated. AND gate 508 receives an inverted version of the output of AND gate 504 along with pulse bit 228b. The output of AND gate 508 is used as delayed bit 228b'. OR gate 510 also receives the output of AND gate 504 along with pulse bit 228c. The output of OR gate 510 is routed to AND gate 512, which also receives an inverted version of the output of AND gate 506. The output of AND gate 512 is used as delayed bit 228c'. Finally, OR gate 514 receives the output of AND gate 516 and pulse bit 228d, and its output is supplied as delayed bit 228d'.

Figure 6:
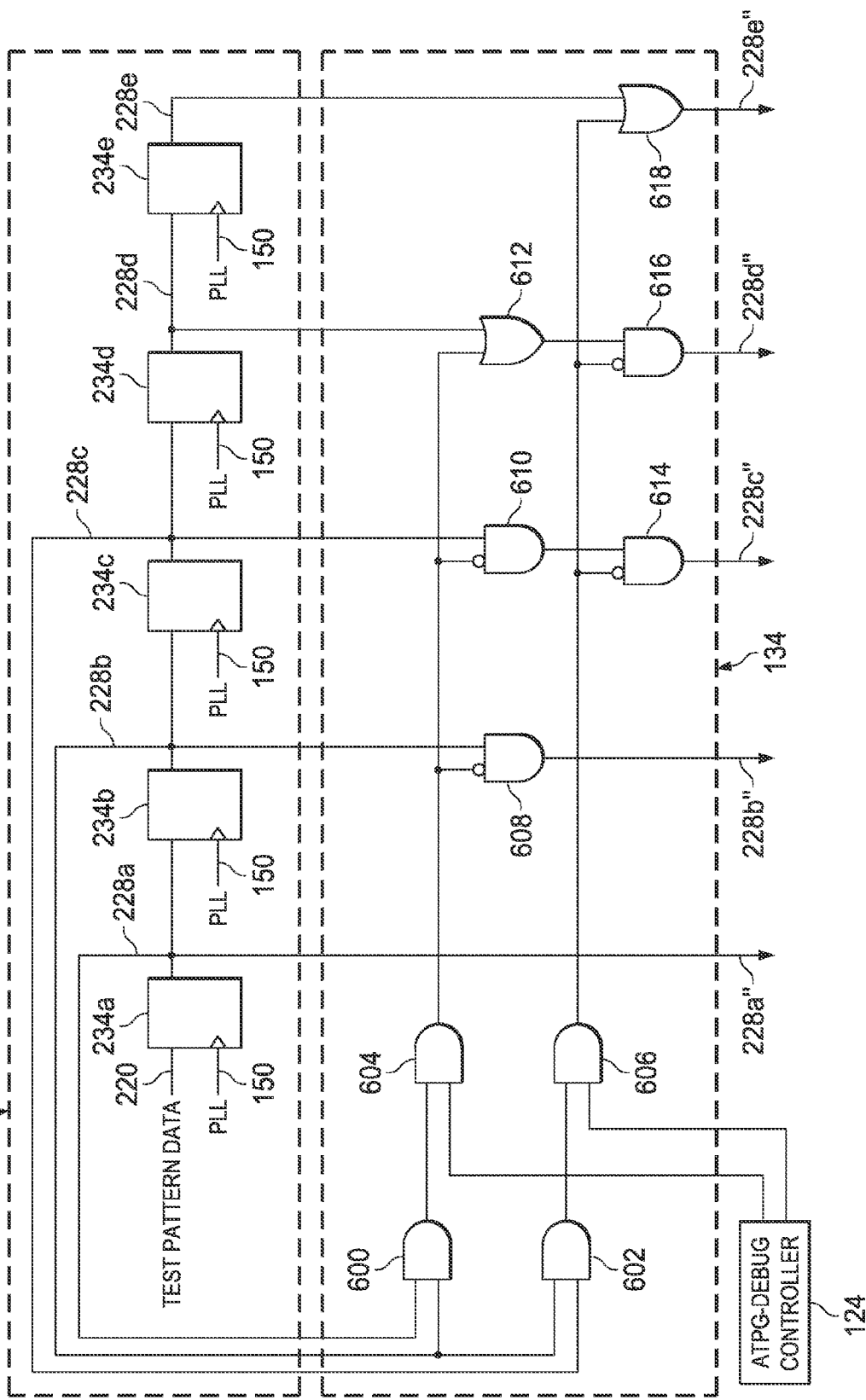
FIG. 6 illustrates a pulse bit manipulating circuit generating pulse bits to help generate ⅓ the frequency of a PLL clock signal.

FIG. 6 illustrates another example of the pulse bit manipulating circuit 134 manipulating the pulse bits 228a-d from the pulse bits unit 118. The pulse bits unit 118 comprises of five flip-flops 234a-e connected in series, with each receiving CLK_OUT 160 as a clock input. In operation, the ATPG-debug controller 124 configures pulse bit manipulating circuit 134 to route pulse bits 228a-e from flip-flops 234a-e through the shown combinational logic to produce delayed bits 228a"-e" that effectively divide the frequency of PLL cock signal 150 by a factor of three. For example, pulse bits 228a-e having values set to "11000" may be translated to "10010," or "01100" may be translated to "01001." While only five flip-flops 234a-e and delayed bits 228a"-e" are shown for the sake of clarity, embodiments may include N number of flip-flops 228 producing N number of delayed bits. Moreover, the illustrated combinational logic can be replicated to scale the pulse bit manipulating circuit 134 to handle more than five pulse bits 228.

One embodiment of the combinational logic in the pulse bit manipulating circuit 134 includes the illustrated collection of AND and OR gates. Translation from inputs to outputs is done in such a way as to instruct OCC 106 to produce a divide-by-three signal of clock pulses 228. AND gate 600 receives as inputs pulse bits 228a and 228b, and AND gate 602 receives pulse bits 228b and 228c. AND gates 604 and 606 each receive the outputs of AND gates 600 and 602, respectively, as one input and are connected to the ATPG-debug controller 124 for the other input. The ATPG-debug controller 124 can selectively access—i.e., turn on—the pulse bit manipulating circuit 134 by passing a high assertion signal to AND gates 604 and 606. Pulse bit 228a is directly mapped to delayed bit 228a" because, in one embodiment, it represents the first clock pulse signal. AND gate 608 receives an inverted version of the output of AND gate 604 along with pulse bit 228b. The output of AND gate 608 is used as delayed bit 228b". AND gate 610 also receives the inverted output of AND gate 604 along with pulse bit 228c. OR gate 612 receives the output of AND gate 604 and 228d. The output of OR gate 610 is routed to AND gate 614, which also receives an inverted version of the output of AND gate 606. The output of AND gate 614 is used as delayed bit 228c". AND gate 616 receives the inverted output of AND gate 606 and the output of OR gate 612, and generates the delayed bit 228d". Finally, OR gate 618 receives the output of AND gate 606 and pulse bit 228e, and the output of OR gate 618 is supplied as delayed bit 228e".

Figure 7:
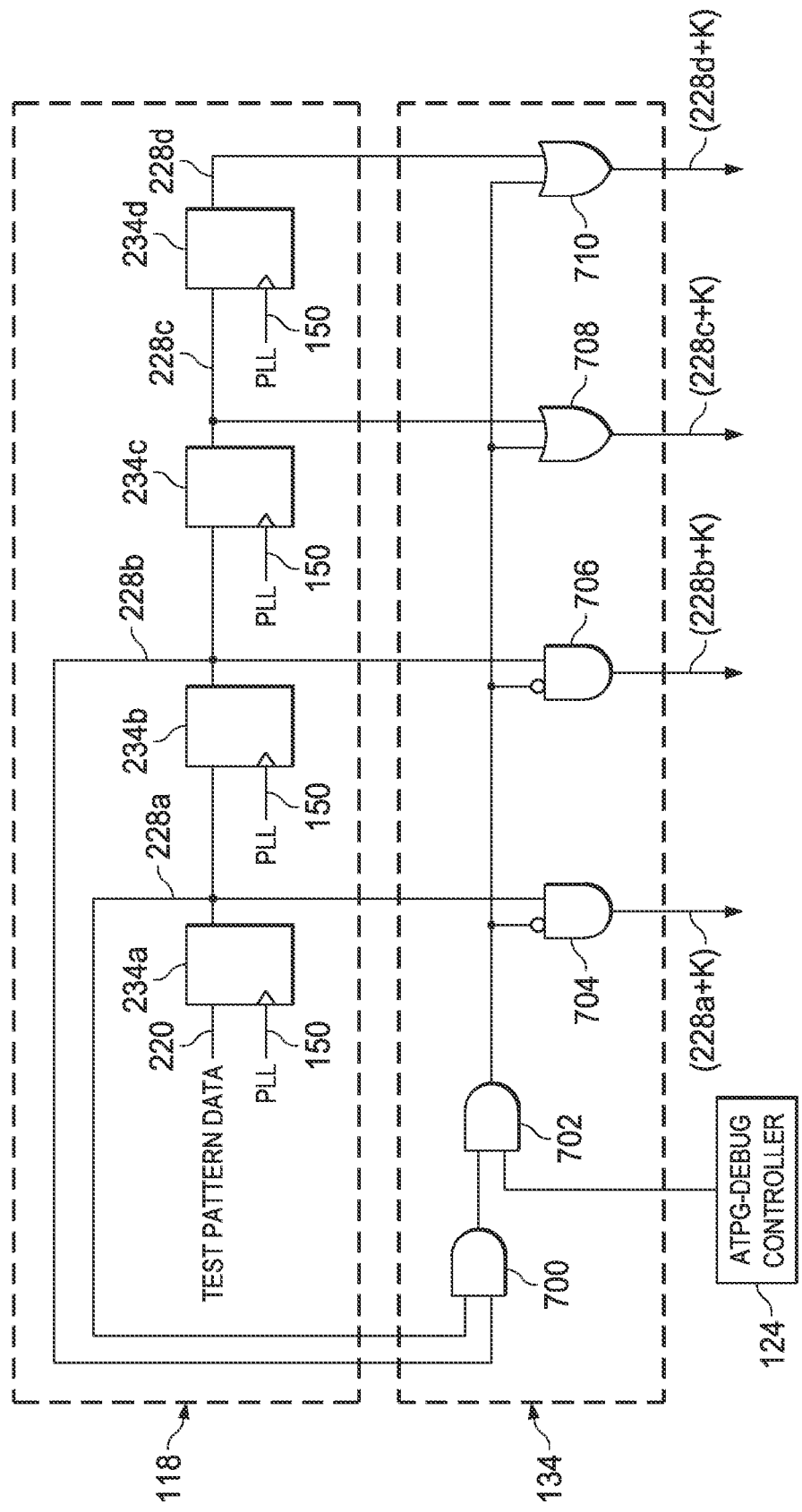
FIG. 7 illustrates a pulse bit manipulating circuit generating manipulated pulse bits to help generate a specific clock-cycle delay.

FIG. 7 illustrates another example of pulse bit manipulating circuit 134 injecting a different kind of delay than dividing a clock signal's frequency. The pulse bit manipulating circuit 134 in FIG. 7 delays the pulse bits 228a-d a fixed number of PLL clock cycles (K) to test whether ATPG failures are being caused by capture mode peak power issues as a result of too many flip-flops in the DUT 120 working at the same time during capture mode. If all, or substantially all, of the OCCs on a chip are sending clock pulses to their respective DUT flip-flops at once, demand for current on the chip may be large enough to cause some flip-flops to malfunction. To rectify this issue, the pulse bit manipulating circuit in FIG. 7 can be selectively used to delay clock pulses by delay K to a time when fewer flip-flops are working. Delay K may be set in predefined, hardcoded positions of pulse bits 128. Adding delay K makes sure that the different OCCs send out at-speed pulses at selective times to minimize peak capture power.

To inject delay K, ATPG-debug controller 124 configures pulse bit manipulating circuit 134 to route the pulse bits 228a-d from flip-flops 234a-d through the shown combinational logic to produce delayed bits 228a-d+K. While only four flip-flops 234a-d and delayed bits 228a-d+K are shown for the sake of clarity, embodiments may include N number of flip-flops 228 producing N number of delayed bits. Moreover, the illustrated combinational logic can be replicated to scale the pulse bit manipulating circuit 134 to add delay K to additional pulse bits 228.

One embodiment of the combinational logic in the pulse bit manipulating circuit 134 includes the illustrated collection of AND and OR gates. AND gate 700 receives as inputs pulse bits 228a and 228b. AND gate 702 receives the outputs of AND gate 700 as one input and is connected to the ATPG-debug controller 124 for the other input. The ATPG-debug controller 124 can selectively access—i.e., turn on—the pulse chain bit mapping circuit 134 by passing a high assertion signal to AND gate 702. AND gates 704 and 706 both receive an inverted version of the output of AND gate 702 along with pulse bits 228a and 228b, respectively. OR gates 708 and 710 both receive the output of AND gate 702 along with pulse bits 228c and 228d, respectively. AND gates 704-706 and OR gates 708-710 produce the delayed pulse bits 228a-d+K for supply to the OCC 106.

Figure 8:
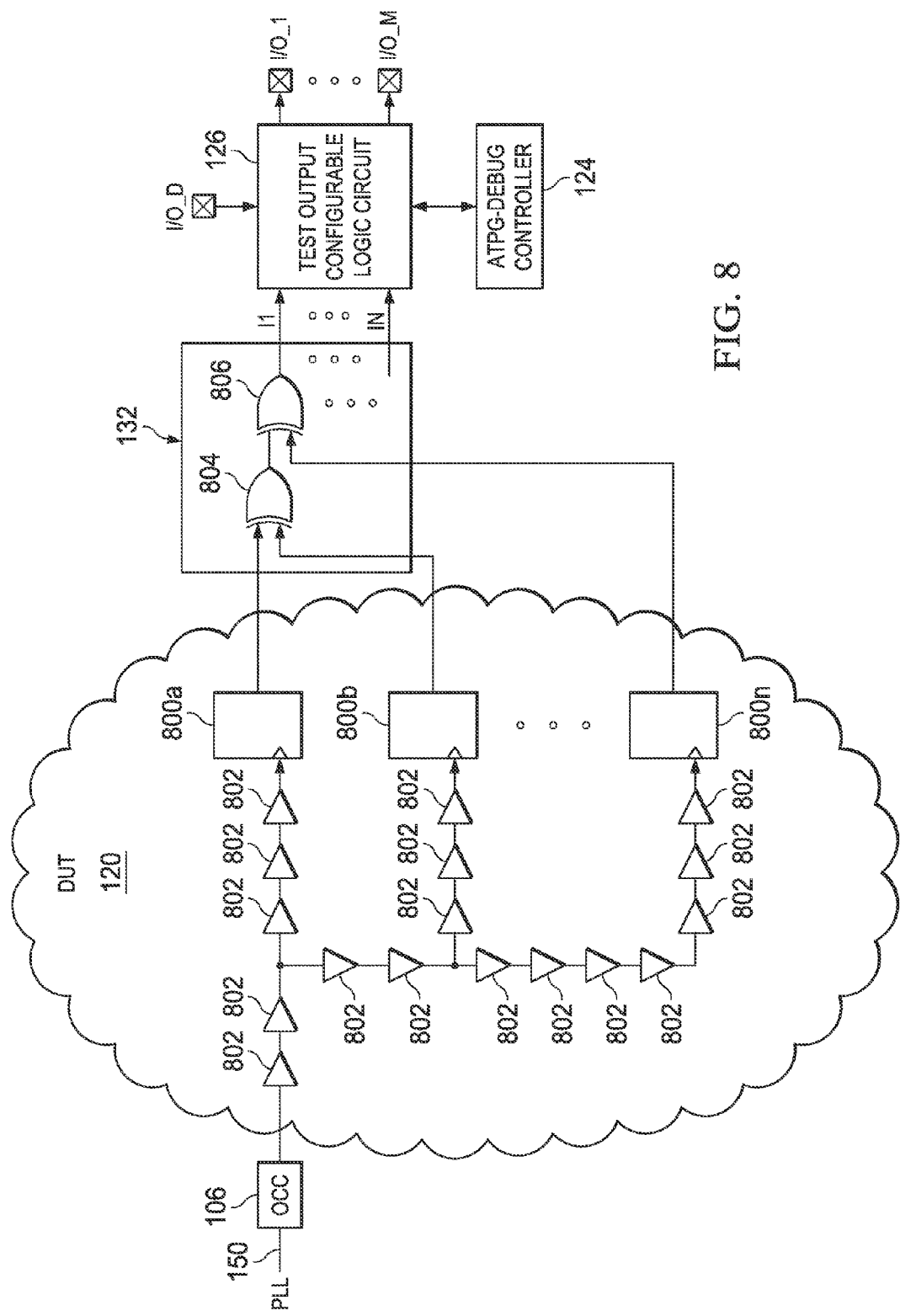
FIG. 8 illustrates a clipping test circuit operating to detect failures due to clock pulse clipping on pulse-width critical flip-flops of a DUT.

FIG. 8 illustrates a test circuit that helps determine if ATPG pattern failures are due to problematic clock pulse clipping from OCC 106. Pulse width critical flip-flops 800a-n in the DUT 120 are known before the chip is sent for manufacturing. A static analysis, executed in software and performed before tape out of the semiconductor chip, of the flip-flops of the DUT 120 can be performed to reveal which flip-flops in the DUT 120 are pulse-width sensitive (referred to herein as "pulse-width critical" flip-flops). These pulse-width critical flip-flops 800a-n are connected to the clipping test circuit 132 as shown. The clipping test circuit 132 can compress outputs from pulse-width critical flip-flops that receive the clock pules of the OCC 106 and make the pulse-width critical flip-flop outputs available for observation on I/O_1-M by ATPG-debug controller 124 configuring test output configurable logic circuit 126.

One embodiment uses XOR gates 804 and 806 connected in the manner shown. Specifically, the outputs of flip-flops 800a and 800b are received as inputs to XOR 804, and the output of XOR 804 is provided as an input to XOR 806. The other input to XOR 806 is the output of flip-flop 800n, and the output of XOR 806 is provided as a first input (I1) to the test output configurable logic circuit 126. As indicated by the ellipses, additional XOR gates can be added to accommodate N number of pulse-width critical flip-flops 800.

When the clipping test 132 is being used, test output configurable logic circuit 126 maps or routes the inputs of I1-N to outputs I/O_1-M—either in a one-to-one mapping, many-to-one, logic-manipulated manner, or a combination thereof I/O_1-M can then be analyzed to determine whether any of the pulse-width critical flip-flops 800a-n are failing because of clipped clock pulses from the OCC 106. Additionally, divide-by-two or divide-by-three configurations from pulse bit manipulating circuit 134 can be activated in parallel to rule out the scenario where clock clipping inside OCC 106 would bring clock edges of clipped clock pulses closer and thus increase the at-speed test frequency, which may be the cause of ATPG pattern failure.

Figure 9:
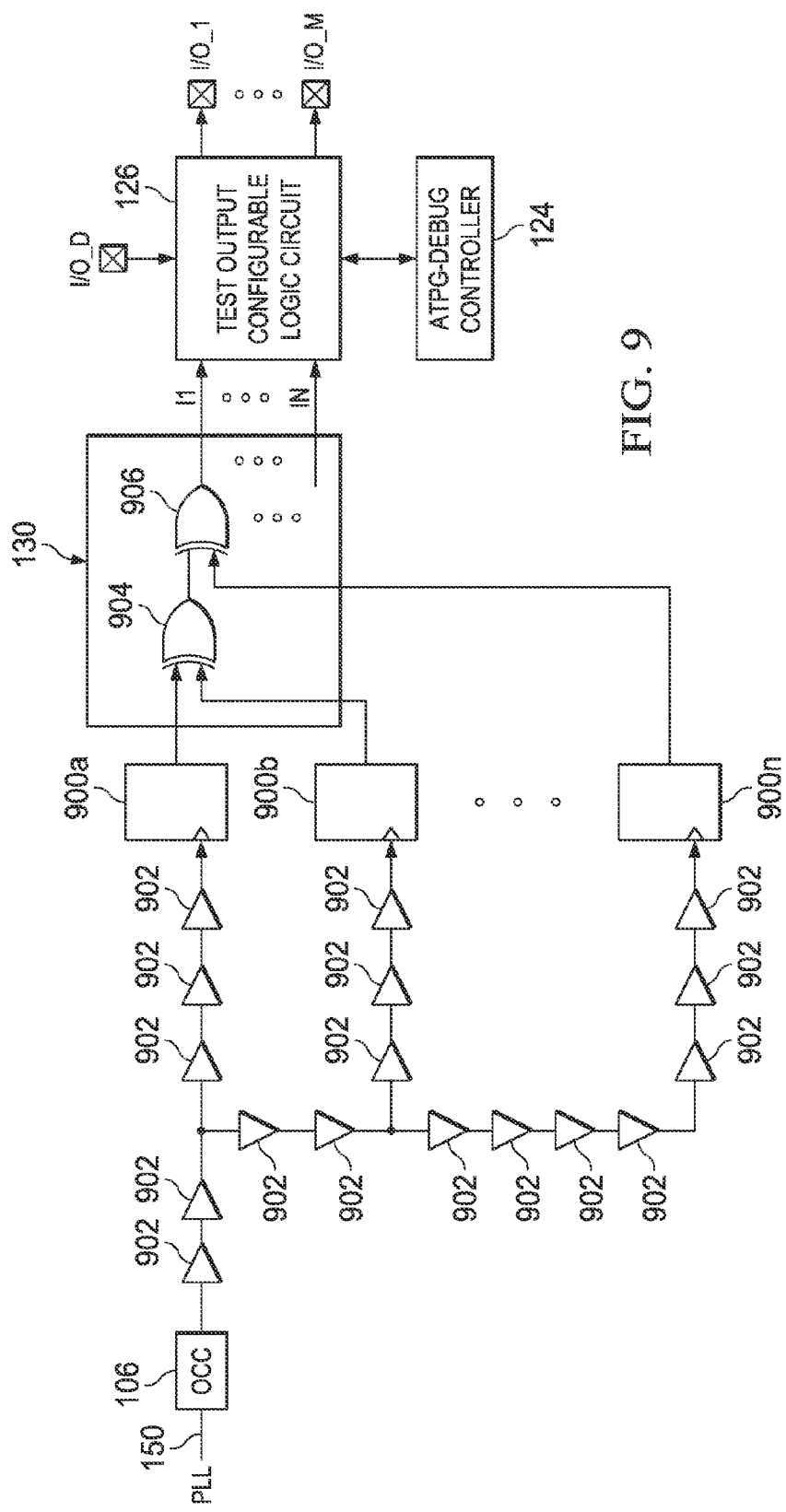
FIG. 9 illustrates an IR drop test circuit operating to detect failures due to IR drops in IR-drop sensitive flip-flops of a DUT.

The same circuit can be used to determine whether ATPG failures are attributable to IR drop in specific flip-flops of the DUT 120. FIG. 9 illustrates an example of the IR drop test circuit 130 for detecting IR drops in flip-flops 900a-n in the DUT 120. Some flip-flops in the DUT 120 are particularly susceptible to IR drop. IR hotspots of in the DUT 120 can be determined by performing a dynamic IR analysis. These IR hotspot flip-flops 900a-n are connected to the IR drop test, as shown.

In operation, OCC 106 receives the PLL clock signal 150 and provides generated clock pulses to the IR hotspot flip-flops 900a-n through a network of circuitry and or delays, collectively shown as 902. The outputs of the IR hotspot flip-flops 900a-n are connected to a sequence of combinational logic that isolates and captures the outputs being produced by each flip-flop 900a-n. One embodiment uses XOR gates 904 and 906 connected in the manner shown. Specifically, the outputs of flip-flops 900a and 900b are received as inputs to XOR 904, and the output of XOR 904 is provided as an input to XOR 906. The other input to XOR 906 is the output of flip-flop 900n, and the output of XOR 906 is provided as a first input (I1) to the test output configurable logic circuit 126. Additional XOR gates can be added to accommodate N number of IR hotspot flip-flops 900.

When the clipping test 132 is being used, test output configurable logic circuit 126 maps or routes the inputs of I1-N to I/O_1-M—either in a one-to-one mapping, many-to-one, one-to-many, logic-manipulated manner, or a combination thereof. Outputs I/O_1-M can then be analyzed to determine whether any of the IR hotspot flip-flops 900a-n are experiencing problematic clipping of clock pulses from the OCC 106. Additionally, the pulse bit manipulating circuit 134 can be activated to inject delay K in the pulse bits 228 in order to distribute capture power more evenly and make peak current demand lower for flip-flops 900a-n.

Figure 10:
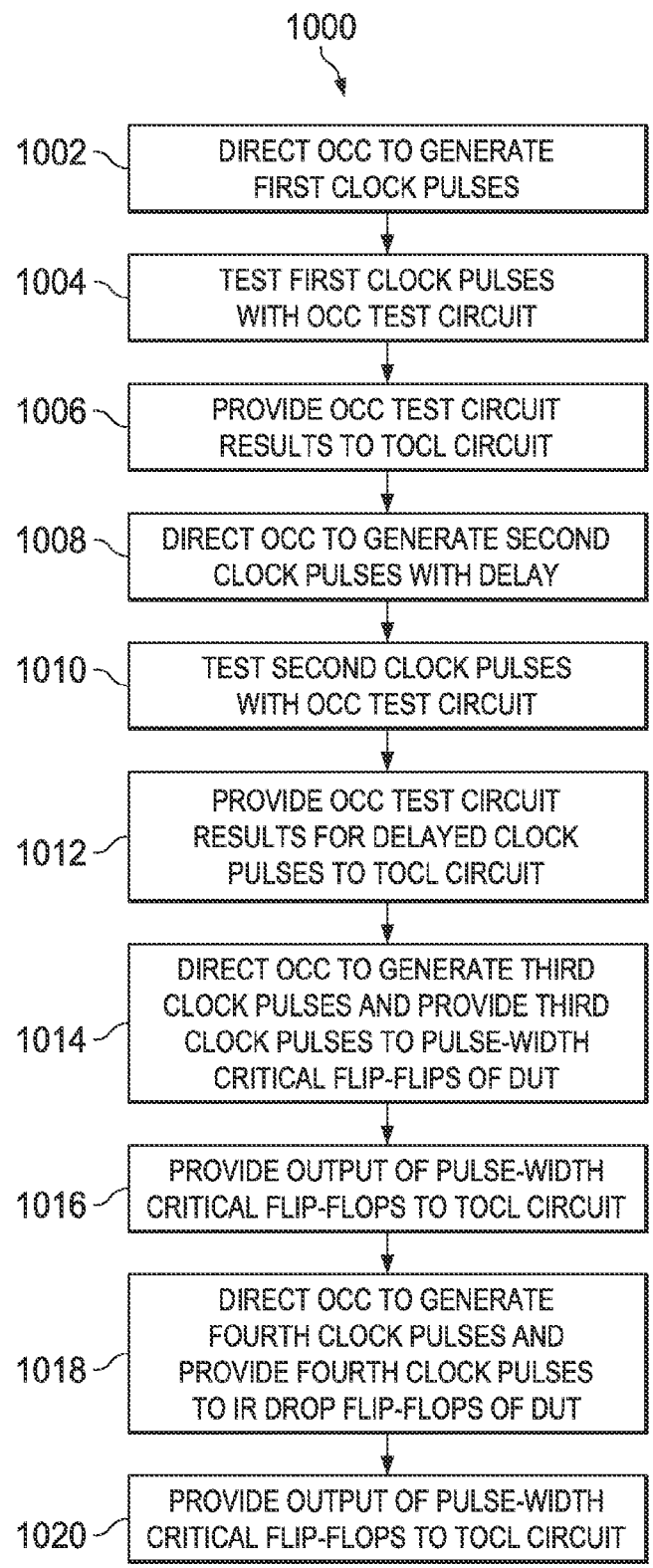
FIG. 10 illustrates a flowchart for testing and debugging OCC logic and particular portions of a DUT.

FIG. 10 illustrates a flowchart for testing and debugging OCC logic and particular portions of a DUT. The shown flow may be carried out by the ATPG-debug controller 124 using a finite state machine (FSM), software, the test circuitry described herein, and the test output configurable logic circuit 126. In one embodiment, testing on the chip is performed by providing multiple instances of the test pattern, either unscathed or delayed, and monitoring the different tests described above, namely the OCC test circuit 128, the IR drop test circuit 132, and the clipping test circuit 132. Results from these tests are provided to the test output configurable logic circuit 126, and the ATPG-debug controller 124 determines when to pass the test results out of the test output configurable logic circuit 126 on I/O_1-M. In one embodiment, a finite state machine (FSM), implemented by the ATPG-debug controller 124, runs the entire ATPG pattern multiple times with an initial run of the ATPG pattern occurring in a default manner with the output of the OCC test circuit 128 being mapped or routed to I/O_1-M. If failure is detected at the I/O_1-M, instructions, either from a tester or from the ATPG-debug controller 124 can instruct the ATPG test pattern to re-run N number of times with loop counter 164 tracking the number of test pattern runs. The FSM detects and knows which ATPG test pattern run is occurring through communication with the through an I/O pin on the test configurable logic circuit 126. For each run test pattern, the FSM, through the ATPG-debug controller 124, selectively connects outputs from the test circuits to I/O_1-M of test output configurable logic 126, allowing different tests to be run for each iteration of the test pattern. The shown steps are presented in a seemingly sequential manner; however, embodiments may perform the steps in a different sequence, in parallel, or omit or add steps.

Looking at flow 1000, initially the OCC 106 is directed to generate a first set of clock pulses, as shown at 1002. The first set of clock pulses is tested by the OCC test circuit 128, as shown as 1004, and the results are provided to the test output configurable logic circuit 1026, as shown at 1006. A second set of clock pulses is generated with a delay using either a frequency divider delay or a specific number of clock cycles (K) delay, as shown at 1008. The OCC 106 is tested again using the delayed clock pulses, as shown at 1010, and the results are provided to the test output configurable logic circuit 1026, as shown at 1012. A third set of clock pulses is generated—either delayed or not—and provided to previously identified pulse-width critical flip-flops of a DUT, as shown at 1014. The resultant outputs of the pulse-width critical flip-flops are provided to the test output configurable logic circuit 1026, as shown at 1016. A fourth set of clock pulses is generated and provided to specific flip-flops previously identified as IR hotspot flip-flops, as shown at 1018. The resultant outputs of the IR hotspot flip-flops are provided to the test output configurable logic circuit 1026, as shown at 1020.

The test output configurable logic circuit 1026 can be directed by the ATPG-debug controller 124 to selectively provide any of the test results (i.e., from the OCC test circuit 128, the IR drop test circuit 130, and the clipping test circuit 132) out as TEST_OUT 170. And TEST_OUT 170 can be analyzed to determine different failures in the DUT 120 or in the OCC 106 logic.

Other embodiments may use different or equivalent circuit designs, implementations or layouts. It should be appreciated that the various embodiments disclosed herein are exemplary. Accordingly, various modifications to these embodiments may be made without departing from the scope of the present disclosure and the claims provided below. The claimed subject matter might also be embodied in other ways, to include different steps or combinations of steps similar to the ones described herein, in conjunction with other present or future technologies.

What is claimed is:

1. A system for interfacing with a design under test (DUT), comprising:
   an on-chip clock controller (OCC) circuit configured to receive a test pattern and responsively generate one or more clock pulses in response to the test pattern;
   an OCC test circuit coupled to the OCC circuit and configured to detect the one or more clock pulses generated by the OCC circuit and generate corresponding OCC test outputs;
   a clipping test circuit configured to capture outputs generated by a plurality of pulse-width critical flip-flops of the DUT and generate corresponding pulse-width debug outputs;
   a test output logic circuit configured to receive the OCC test outputs and the pulse-width debug outputs; and
   a debug controller operable to configure the test output logic circuit to selectively map the OCC test outputs and the pulse-width debug outputs to a test output.

2. The system of claim 1, further comprising a pulse bit manipulating circuit configured to delay input pulse bits instructing the OCC circuit on generating the one or more clock pulses.

3. The system of claim 2, wherein a second instance of the test pattern is provided to the OCC circuit after the one or more clock pulses are generated, the second instance of the test pattern data being generated in response to manipulated input pulse bits.

4. The system of claim 3, wherein resultant outputs of the OCC circuit in response to the second instance of the test pattern are provided to the test output logic circuit, and the debug controller is operable to switch the test output to reflect the resultant outputs of the OCC circuit in response to the second instance of the test pattern.

5. The system of claim 1, wherein the debug controller determines whether a clipping error exists based on the pulse-width debug outputs.

6. The system of claim 1, further comprising an IR drop test circuit configured to capture outputs of a plurality of IR hotspot flip-flops located in the DUT and provide the outputs to the test output logic circuit, said debug controller further operable to configure the test output logic circuit to selectively map the OCC test outputs, the pulse-width debug outputs and the IR hotspot flip-flops outputs to the test output.

7. A method for interfacing with a design under test (DUT), comprising:
   directing an on-chip clock controller (OCC) circuit receiving a scan enable signal signaling two modes of operation to generate a first set of clock pulses corresponding to a pulse bit chain test pattern and generate a second set of clock pulses corresponding to a manipulated pulse bit chain test pattern;
   generating first debug data based on the first set of clock pulses and supplying the first debug data to a test output logic circuit, wherein the test output logic circuit comprises one or more input/output (I/O) pins;
   generating second debug data corresponding to the manipulated pulse bit chain test pattern and supplying the second debug data to the test output logic circuit; and
   selectively routing the first and second debug data through the test output logic circuit to the I/O pins.

8. The method of claim 7, further comprising:
   providing the first or second set of clock pulses to pulse-width critical flip-flops in the DUT;
   retrieving flip-flop outputs from the pulse-width critical flip-flops in the DUT in response to the provided first or second set of clock pulses; and
   switching the outputs of test output logic circuit for the I/O pins from the first or second debug data to the flip-flop outputs from the pulse-width critical flip-flops.

9. The method of claim 8, further comprising providing the first or second set of clock pulses to a plurality of IR drop flip-flops in the DUT;
   retrieving flip-flop outputs from the IR drop flip-flops in the DUT in response to the provided first or second set of clock pulses; and
   switching the outputs of test output logic circuit for the I/O pins to the flip-flop outputs from the IR drop critical flip-flops.

10. The method of claim 9, further comprising:
    directing the OCC circuit to generate a third set of clock pulses based on the test pattern or the delayed version of the test pattern;
    providing the third set of clock pulses to a plurality of pulse-width critical flip-flops in the DUT;
    retrieving first flip-flop outputs from the pulse-width critical flip-flops in the DUT in response to the provided third set of clock pulses;
    switching the outputs of test output logic circuit to the first flip-flop outputs from the pulse-width critical flip-flops;
    directing the OCC circuit to generate a fourth set of clock pulses based on the test pattern or the delayed version of the test pattern;
    providing the fourth set of clock pulses to a plurality of IR drop flip-flops in the DUT on the chip;
    retrieving second flip-flop outputs from the IR drop flip-flops in the DUT in response to the provided fourth set of clock pulses; and
    switching the outputs of test output logic circuit to the second flip-flop outputs from the IR drop critical flip-flops.

11. A system for interfacing with a design under test (DUT), said design under test including IR drop sensitive flip flops and pulse width sensitive flip flops, comprising:
    an on-chip clock controller (OCC) circuit receiving a test pattern and generating clock pulses in response to the test pattern;
    a scan chain of flip flops clocked by said clock pulses and coupled to said design under test;
    an OCC test circuit receiving said clock pulses and configured to generate first test data indicative of whether the clock pulses correspond to the test pattern;
    an IR drop test circuit receiving first signals from the device under test and generating second test data indicative of test failure by the IR drop sensitive flip flops;

a clipping test circuit receiving second signals from the device under test and generating third test data indicative of test by the pulse width sensitive flip flops;

a logic circuit receiving the first, second and third test data, said logic circuit having a plurality of output lines, said logic circuit being configurable to selectively choose from the first, second and third test data for output on said plurality of output lines; and a debug control circuit configured to control the logic circuit in selective choosing.

12. The system of claim 11, wherein the logic circuit is configured as a multiplexer circuit controlled by the debug control circuit to switch between the first, second and third test data for output on said plurality of output lines.

13. The system of claim 11, wherein the logic circuit is configured as a router circuit controlled by the debug control circuit to map certain ones of the first, second and third test data for output on said plurality of output lines.

14. The system of claim 11, wherein the logic circuit is configured as a Boolean operation circuit controlled by the debug control circuit to logically combine certain ones of the first, second and third test data for output on said plurality of output lines.

15. The system of claim 11, wherein the system is responsive to a scan enable signal having a first logic state indicating operation in a shift mode with respect to the scan chain and having a second logic state indicating operation in a capture mode with respect to the scan chain, wherein said debug control circuit is further configured to control the logic circuit in selective choosing from the first, second and third test data for output on said plurality of output lines while said scan enable signal is in the second logic state indicating operation in the capture mode.

16. The system of claim 15, wherein the output on said plurality of output lines is compared with expected data on automatic testing equipment (ATE) when the scan enable signal is in the second logic state indicating operation in the capture mode.

17. The system of claim 11, further comprising a pulse bit manipulating circuit configured to delay input pulse bits instructing the OCC circuit on generating the clock pulses.

18. The system of claim 11, wherein the OCC generates the clock pulses in further response to an input clock signal, and wherein a status signal for said input clock signal is provided to the logic circuit, said logic circuit further configurable to selectively choose from the first, second and third test data and said status signal for output on said plurality of output lines.

* * * * *